United States Patent [19]

Schodowski

[11] Patent Number: 4,872,765
[45] Date of Patent: Oct. 10, 1989

[54] DUAL MODE QUARTZ THERMOMETRIC SENSING DEVICE

[75] Inventor: Stanley S. Schodowski, Wayside, N.J.

[73] Assignee: The United States of America as represented by the Secretary of the Army, Washington, D.C.

[21] Appl. No.: 487,560

[22] Filed: Apr. 20, 1983

[51] Int. Cl.$^4$ ............................................. H01L 41/10
[52] U.S. Cl. ...................... 374/117; 310/318; 331/116 R
[58] Field of Search .................. 331/66, 116 R, 176; 374/116 R, 153, 154; 310/318, 315, 361; 73/339 A

[56] References Cited

U.S. PATENT DOCUMENTS

| | | | |
|---|---|---|---|
| 3,355,949 | 12/1967 | Elwood et al. | 374/117 |
| 4,079,280 | 3/1978 | Kusters et al. | 310/318 |
| 4,159,622 | 6/1979 | Akahane | 331/176 X |
| 4,160,183 | 7/1979 | Kusters et al. | 310/318 |
| 4,233,843 | 11/1980 | Thompson et al. | 374/117 |
| 4,325,036 | 4/1982 | Kuwabara | 331/176 |
| 4,345,221 | 8/1982 | Zumsteg | 331/176 |
| 4,415,870 | 11/1983 | Zumsteg | 331/176 |
| 4,468,634 | 8/1984 | Takagi et al. | 331/176 X |

OTHER PUBLICATIONS

Bottom, Virgil E. *Introduction to Quartz Crystal Unit Design* Chapt. 8, Frequency Constants . . . Van Nostrand Reinhold Company, pp. 134–137, 1982.

*Primary Examiner*—Brian S. Steinberger
*Attorney, Agent, or Firm*—Michael J. Zelenka; Maurice W. Ryan

[57] ABSTRACT

A circuit is shown for representing the internal temperature of a crystal, through a combination of certain harmonic frequencies excited in that crystal. By forming a signal which is equal to $nF_A - F_B$, i.e., n times a lower harmonic frequency minus $F_B$, an nth harmonic frequency, or $F_A - 1/n\ F_B$, e.g., it is possible to have a signal which is near linearly dependent upon temperature which can be used in representing same. This composite signal is also seen to be highly sensitive to temperature changes yielding an improved thermometric system as compared to conventional systems.

14 Claims, 4 Drawing Sheets

DUAL MODE QUARTZ THERMOMETRIC SENSING DEVICE

The invention described herein may be manufactured, used, and licensed by or for the Government for Governmental purposes, without the payment to me of any royalties thereon.

BACKGROUND AND FIELD OF INVENTION

In the field of crystal oscillator devices, a matter of great importance is to accurately sense the temperature of the quartz resonator to perform either measurement, e.g., thermometry, or compensation and control for the purpose of frequency stabilization against variations in temperature.

In thermometry, conventional methods of sensing on the change in resistivity of the material or use electromechanical devices such as thermometric cut quartz resonators, whose operation depend on a change of resonant frequency. The latter mentioned resonator devices allow the measurement of temperature with exceptionally high accuracy and resolution. The possibility of accomplishing the same measurement, yet while requiring only a resonator manufactured without precision control over its angle of cut unlike the above mentioned resonators, would clearly be most useful.

Conventional methods for frequency stabilization by means of compensation and control rely on external temperature sensors such as described above and are inefficient in indicating the actual and instantaneous temperature of the quartz resonator to be compensated or controlled for frequency variation under varying conditions. One suggested method of resonator self temperature sensing, i.e. not employing an external temperature sensor is to use the B mode signal of a typical SC-cut crystal to secure temperature and to effect compensation and control over the C mode signal. It seems, however, that the B mode is not reliable for temperature sensing applications in currently designed resonators because of excessive and uncontrollable activity dips resulting from readily coupled undesired modes. The B mode also experiences difficulty in accurately sensing the C mode temperature because of the B mode's excessive hysteresis, i.e. thermal non-repeatability, and inadequate thermal transient performance.

A thermometry method of utilizing a quartz resonator temperature sensor not having a special precision thermometric cut, thereby permitting use of general utility crystal cuts of the thickness shear variety and a frequency stabilization method of utilizing other than the usual B and C modes of a doubly rotated cut for this purpose, and in addition of having a reliable and accurate means of self temperature sensing is of course highly desirable.

BRIEF DESCRIPTION OF THE INVENTION (C) The invention combines a pair of C mode harmonics of a unique frequency according to this invention. In this invention, a pair of selected C mode harmonics signals, related by the ratio (N) of their harmonic numbers, are generated in a dual mode oscillator and then combined after the lower harmonic signal has been multiplied by N or the higher harmonic signal has been divided by N. After combining which involves mixing the harmonic related signals to obtain sum and difference frequencies, the combined signal is passed through a low pass filter to select the desired output signal which may be either the difference between the high harmonic frequency and the multiplied frequency or the lower harmonic frequency and the divided higher harmonic frequency. The output of the low pass filter is near linearly proportional to resonator temperature and thus may be used to represent it if desired.

OBJECTS OF THE INVENTION

An object of this invention is to provide a quartz thermometer not requiring special thermometric cuts.

Another object of this invention is to achieve self temperature sensing in a quartz resonator using temperature stable harmonic modes.

BRIEF DESCRIPTION OF THE FIGURES

Other objects and advantages of the invention will become readily apparent in connection with the specification and accompanying Figures in which.

DETAILED DESCRIPTION OF THE INVENTION

Figure 1:
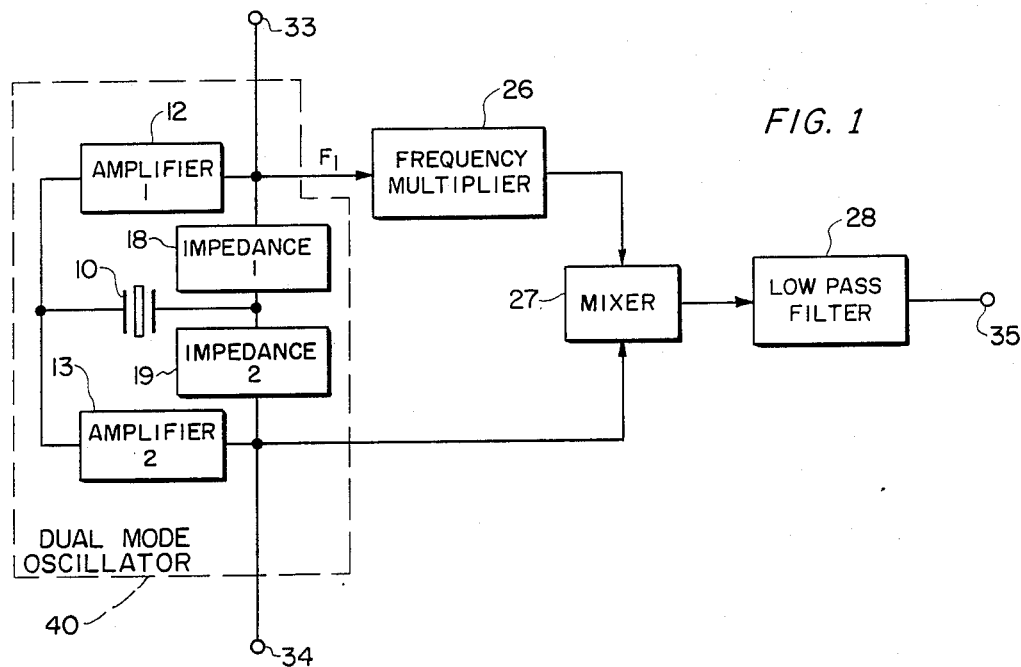
FIG. 1 is a block diagram of an embodiment of the invention in which a two loop dual harmonic mode crystal oscillator is used in conjunction with an external multiplier, mixer, and low pass filter to sense resonator temperature.

In FIG. 1, a circuit is shown, whose operation is meant to embody the equation: $F_o = \eta F_A - F_B$ where $F_B$ is an oscillator's higher harmonic frequency, and $F_A$ is the lower harmonic frequency and n is the ratio of their respective harmonic numbers. $F_o$, the combination frequency according to that equation, is meant to be a signal whose frequency is linearly proportional to temperature as will be explained. The signal $F_o$ therefore can be used in showing temperature; $F_o$ is shown as an output 35 in the Figure. In one equation, the relationship of frequency change to temperature change is given by $$\frac{\Delta F_o}{F_o} = \frac{(na_1 - ka_n)\Delta T + (nb_1 - kb_n)\Delta T^2 + (nc_1 - kc_n)\Delta T^3}{n - k}$$

where $k = F_B/F_A$, and $a_1$, $a_n$, $b_1$, $b_n$, $C_1$, and $C_n$ are constants. For typical values, the first term dominates the entire expression within the temperature range of interest. It should be noted that the temperature sensitivity has been enhanced by using the frequency $F_o = nF_A - F_B$.

The crystal shown at 10 may be, for example a crystal unit of any thickness shear variety, either a singly or doubly rotated crystal cut, vibrating in two harmonic C modes simultaneously. The amplifier 12 may be embodied by an active gain element and frequency selective network having correct phase shift and gain to excite only the lower of the selected harmonic one. The amplifier 13 may be embodied by an active gain element and frequency selective network having correct phase shift and gain to excite only the higher of the selected harmonic C modes, for example the third harmonic (overtone) with harmonic number three. The concept underlying generation of this crystal's C mode harmonics, i.e., having loop gain designed greater than one and net phase shift made equal to zero at desired C mode harmonic frequencies, is utilized here.

The frequency multiplier circuit 26 is devised to multiply the lower of the excited C modes by a factor (n) equals 3 for selected C modes having the harmonic numbers 1 and 3. To be noted is that, instead of multiplying the lower mode, it is also possible to divide the higher mode by the same factor instead as will be explained further below. The signal mixer 27 is comprised of active or passive nonlinear elements to produce and enhance the sum and difference frequencies of the multiplied lower C mode and the higher C mode signals. The impedance unit 18 is chosen for minimizing coupling from the higher harmonic C mode signal such as to reduce interaction with the adjacent oscillating loop, also to control drive level of the lower harmonic C mode oscillations. The impedance unit 19 is chosen to minimize coupling from the lower adjacent oscillating loop and also to control drive level of higher C mode harmonic oscillations. Impedance units 18, 19 might be embodied by resistors in certain cases. The unit 28 is a low pass active or passive filter to select and/or detect the difference frequency between the multiplied lower harmonic C mode and the higher harmonic C mode signals. While shown as a separated element, the functions of 28 as well as 27 could actually be designed to be done internally to the oscillator circuit 40, as will be explained. The output terminal 33 yields the lower harmonic C mode signal and output terminal 34 yields the higher harmonic C mode signal. Output terminal 35 yields the proposed thermometer output signal which frequency equals the difference between the n times the lower harmonic C mode frequency and the higher harmonic C mode frequency.

Figure 2:
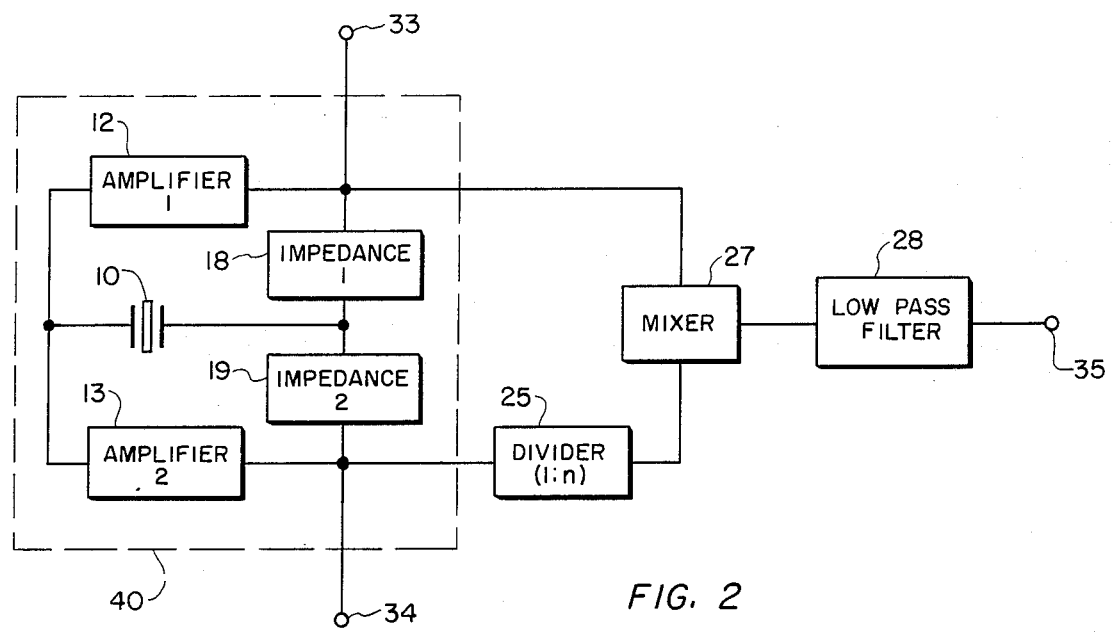
FIG. 2 is a block diagram of another embodiment of the invention in which a two loop dual harmonic mode crystal oscillator is used in conjunction with an external divider, mixer and low pass filter to sense resonator temperature.

The circuit of FIG. 2 is similar to that of FIG. 1 except that the multiplier element 26 has been replaced with the divider element 25 which now divides the higher harmonic signal by the harmonic number ratio n. The operation of the circuit is embodied by the equation $F_o = F_a - F_{b/n}$ and which output fractional frequency deviation, $\Delta F_o/F_o$, is identical in magnitude and slope to the fractional frequency deviation of the output signal from the circuit of FIG. 1.

Figure 3:
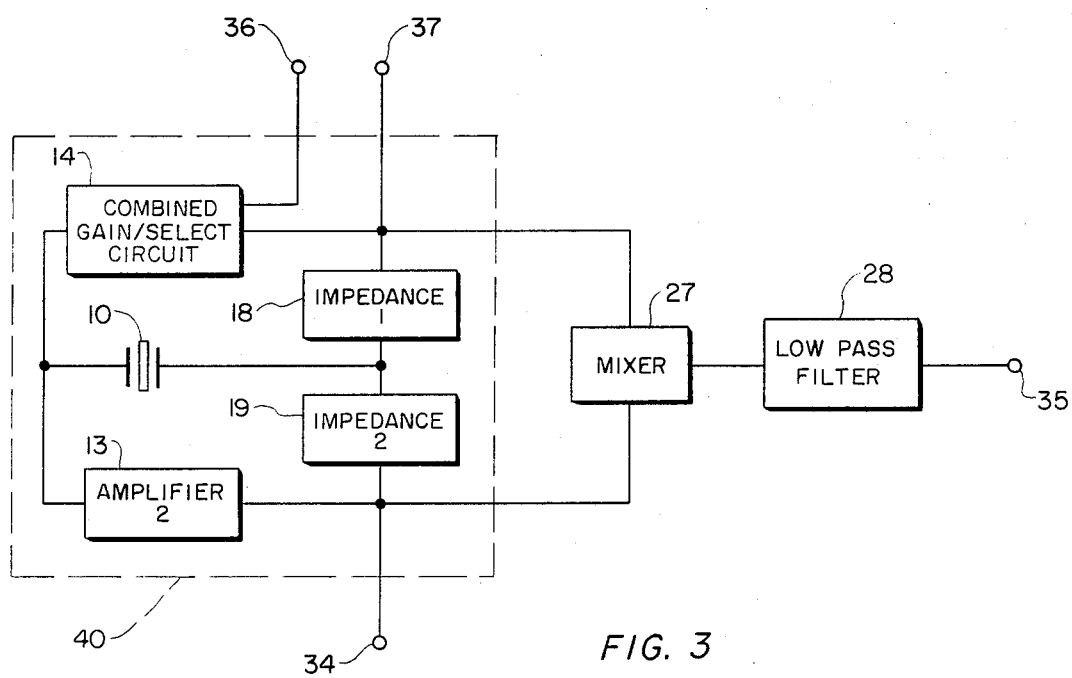
FIG. 3 is a block diagram of still another embodiment of the invention in which a two loop dual harmonic mode crystal oscillator with enhanced harmonic content is used in conjunction with an external mixer and low pass filter to sense resonator temperature.

The circuit of FIG. 3 can perform the same function as that of FIG. 1 except that the amplifier 12 and the multiplier 26 has been replaced by an amplifier 14 which is embodied by an active gain element and two frequency selective networks; one having correct phase shift and gain to excite only the lower of the selective harmonic C modes as previously, and the other to select N times the fundamental C mo e signal generated for output at terminal 37, by the nonlinear operation of the active device controlled by selection of the operating point. The output terminal 36 yields the lower harmonic C mode signal.

Figure 4:
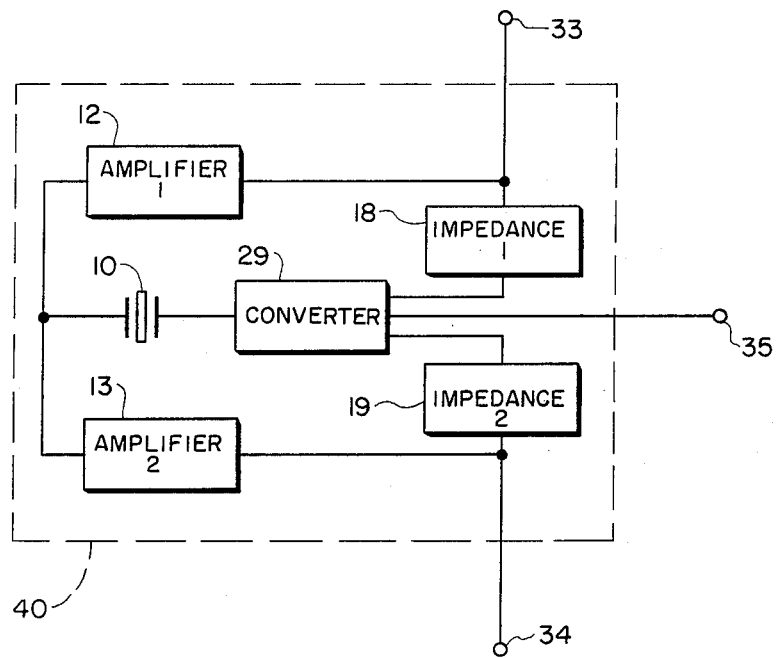
FIG. 4 is a block diagram of yet another embodiment of the invention in which a two loop dual harmonic mode crystal oscillator having introduced nonlinearity and frequency selection is used to directly secure resonator temperature.

The circuit of FIG. 4 can provide the same output as the circuit in FIG. 1 except that the multiplication, mixing and selection, for example, elements 26,27 and 28 of FIG. 1 are done internally to the oscillator circuit 40. Converter element 29 is embodied for example by a passive or active nonlinear device which combines the C mode harmonic frequencies and a selective network which yields the output signal at terminal 35. The converter 29 is designed to pass the C mode harmonic frequencies without introducing additional phase shift such as to excite the pair of harmonic C modes in the normal manner.

Figure 5:
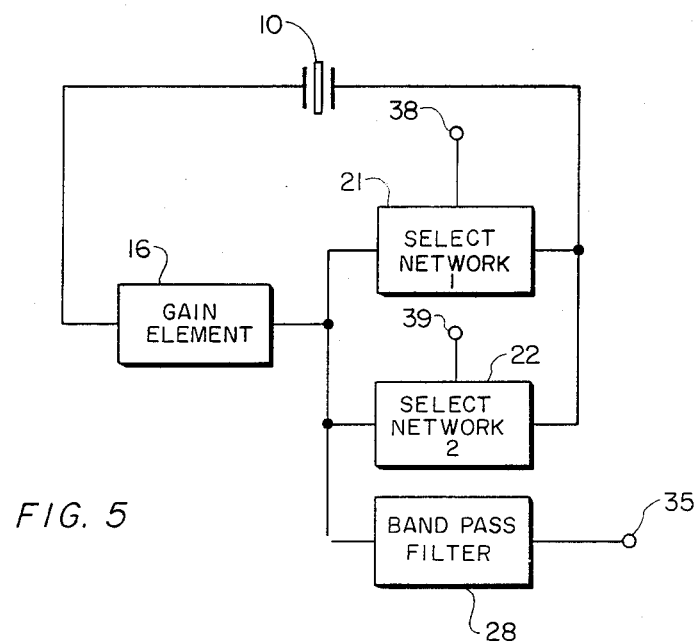
FIG. 5 is a block diagram of a still further embodiment of the invention in which a single loop dual harmonic mode oscillator having enhanced nonlinear distortion is used in conjunction with a low pass filter to secure resonator temperature.

The circuit of FIG. 5 can provide the same output as the circuit of FIG. 1 except that the pair of harmonics are excited within a single loop oscillator containing only one gain element 16 which is biased to produce enhanced nonlinear distortion and sum and difference products as a result of the amplifier's limiting process. Selective network elements 21 and 22 perform in unison to permit only the passage of the harmonic C mode frequencies with the correct phase shift and gain to meet the condition for oscillation and yield the lower and higher harmonic frequencies at terminals 38 and 39 respectively. A bandpass filter element 28 selects the correct mixing product $F_o = nF_A - F_B$.

Figure 6:
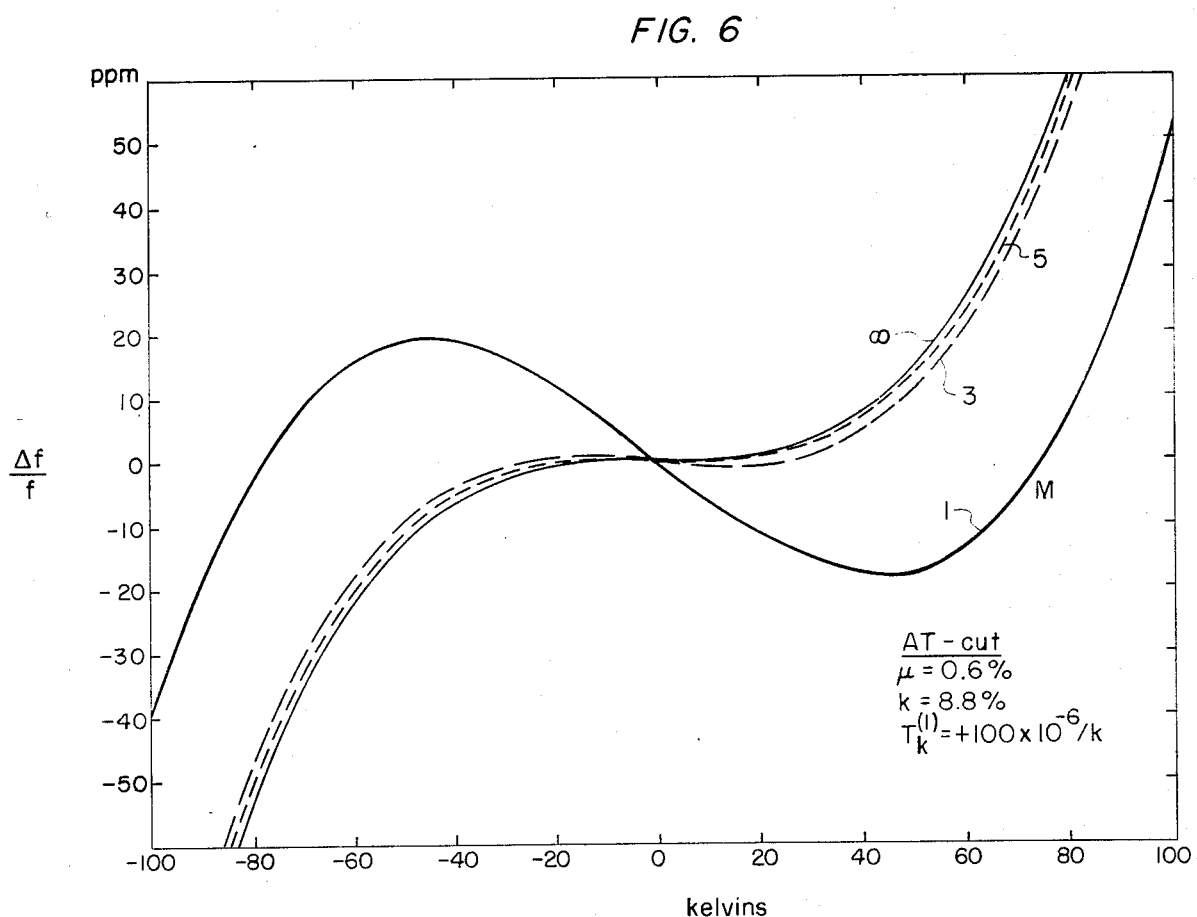
FIG. 6 shows a chart of frequency-temperature harmonic characteristics of certain AT-cut quartz resonators.
Figure 7:
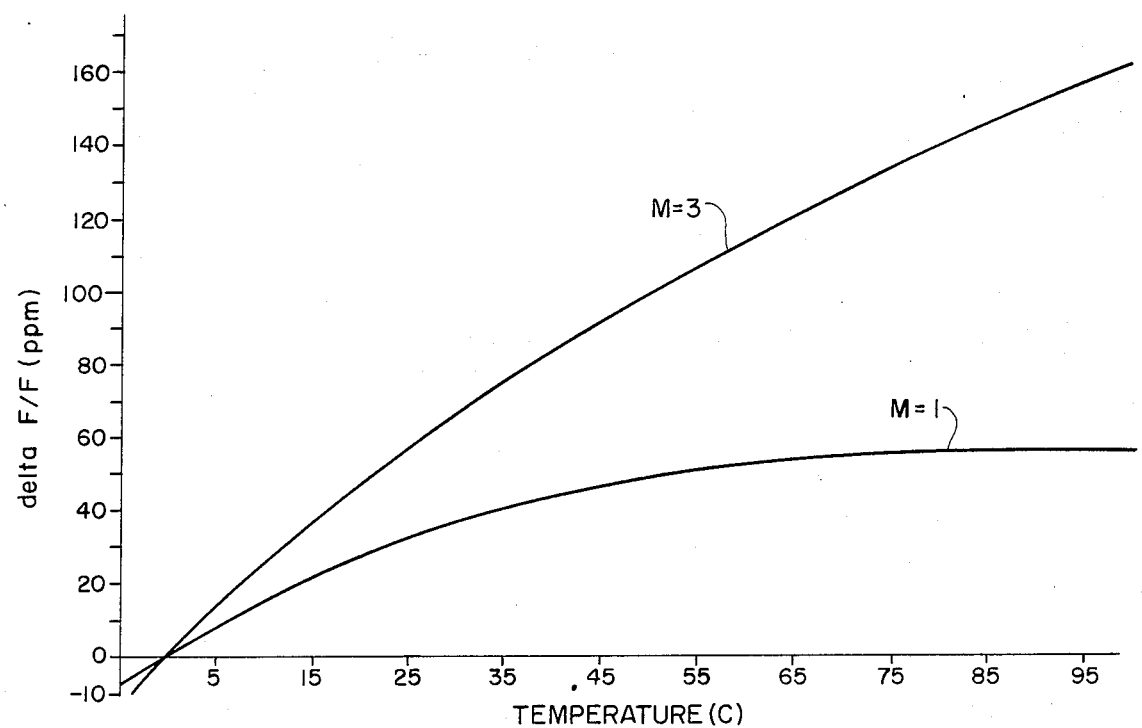
FIG. 7 is a graph showing relationship of the crystal's first and third harmonic frequencies to temperature.
Figure 8:
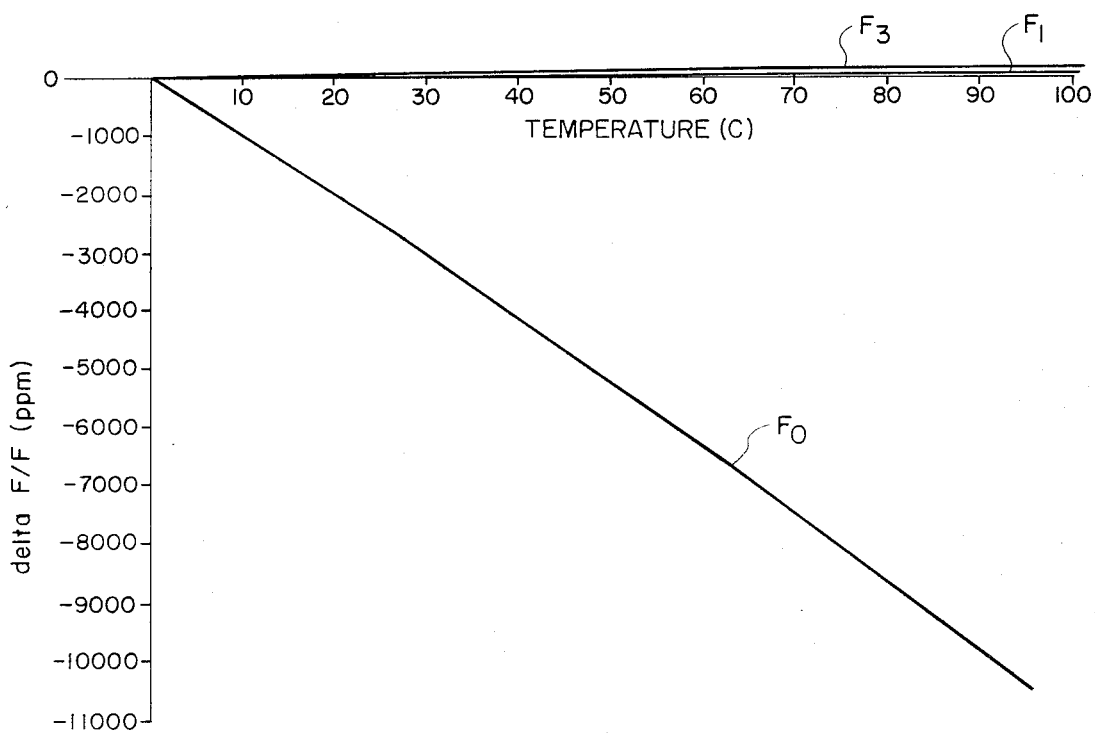
FIG. 8 shows the relation of frequency $F_o$ with temperature, being a linear relation thereof.

FIG. 6 illustrates the frequency variation, with temperature, of various harmonics of a crystal, such as an AT-cut quartz resonator. FIG. 7 illustrates the frequency variations, with temperature, of two specific harmonics, the first and third, of an SC cut crystal. As has been explained, it is possible to combine the first and third harmonics as shown in FIG. 7 in such a way as to obtain a frequency which is linearly dependent with temperature. FIG. 8, showing the fractional frequency deviation of $F_o = 3F_1 - F_3$ for the harmonics shown in FIG. 7, is one such illustration of obtaining a linear or nearly linear, temperature dependent frequency, which can be used to represent temperature. As mentioned, not only is the frequency $F_o$ linear with temperature, but its variation is highly sensitive with temperature, to be well noted, as compared with known methods. A value of 110ppm/$^o C$ sensitivity is actually considered possible with this circuit.

OPERATION

The dual harmonic mode quartz thermometer circuit such as was described, functions to provide an output frequency which is near linearly related to the resonator's temperature as was mentioned. The rationale of using the beat frequency is based upon using the apparent orientation angle change of a resonator's harmonic frequency temperature characteristic as depicted in FIG. 6, and as described by A. Ballato in Technical Report ECOM 4498, "Temperature Compensated Crystal Oscillator (TCXO) Design Aids: Frequency Temperature Resonator Characteristics shifted by series capacitor". The apparent orientation angle change with increasing harmonic of operation is believed due primarily to the change in the first order temperature coefficient of frequency. Therefore, the crystal unit's normalized harmonic F/T characteristics can be described as a family of curves exhibiting an effective linear rotation. This invention is configured such as to extract the effective linear rotation between a pair of harmonic F/T characteristics in a manuever which results in a useful monotonic output having a desirable high F/T sensitivity. The crystal 10 in one embodiment, is a thickness shear resonator which may be a singly or doubly rotated cut, for example, an AT or SC cut, respectively, which is excited simultaneously in a pair of its harmonic C modes by frequency selective gain elements 12 and 13. Typical normalized F/T characteristics of the separate harmonic C mode signals of an SC cut crystal is shown in FIG. 7. The intended signal having normalized F/T characteristic exhibiting the thermometer output is shown in the chart of FIG. 8. The lower C mode harmonic frequency is then multipleed by the frequency multiplication element 26 by a factor (n) equal to the ratio of the higher to lower harmonic number. Since the higher harmonic (overtone) frequency of the resonator is not an even multiple of the fundamental harmonic, as controlled by resonator design, the two signals approaching at the input to mixer 27 are unequal. This condition permits the difference frequency output to be single valued and useful for temperature sensing. A low pass filter element 28, if necessary, suppresses the undesirable frequencies, e.g., the main input frequencies and other mixing products. The nominal difference output frequency can be expressed as $B/A \times F_{m=A} - F_{m=B}$ where A is the lower harmonic number and B is the larger harmonic number. The slope of the output difference frequency may be made positive or negative by adjusting the electrode diameter of the resonator.

Even though only certain embodiments for a dual mode crystal oscillator have been shown in the description it should be understood that there are many embodiments that could fulfill the functions described for this invention and for portions of the circuits shown in the Figures. Thus, while the invention has generally been described with respect to certain embodiments overall, it should be recognized to those skilled in the art that numerous modifications and substitutions may be made within the spirit and scope of the invention and the appended claims.

What is claimed is:

1. Apparatus for sensing temperature comprising, in combination:
   a single resonator means connected for generating at least two different C-mode harmonic frequency single as defined as $F_A$ and $F_B$, wherein $F_B$ has a higher harmonic number relative to $F_A$, the ratio of the higher harmonic number to the lower harmonic number being defined as N;
   means for generating a third signal whose frequency is N times the frequency of $F_A$; and
   means for generating a fourth signal which is the resultant of the subtraction of $F_B$ from said third signal, wherein said fourth signal is used in the sensing of temperature.

2. Apparatus as in claim 1 further comprising means for exciting said resonator means for generating said at least two frequency signals, the means for exciting comprising:
   a two loop dual mode oscillator circuit wherein a first loop of said circuit comprises a first loop of said circuit which comprises a first active gain element and frequency selective network for exciting only a lower mode signal, $F_A$, and wherein a second loop of said circuit comprises a second active gain element and frequency selective network for exciting only a higher mode signal, $F_B$, in the said resonator means.

3. Apparatus as in claim 2 further comprising first impedance unit in said first loop for controlling drive levels of $F_A$ signal oscillations and for minimizing coupling from adjacent signal $F_B$ oscillations in said second loop, and a second impedance unit in said second loop for controlling drive levels of $F_B$ signal oscillations and for minimizing coupling from adjacent signal $F_A$ oscillations in said first loop.

4. Apparatus as in claim 3 further comprising means for filtering said fourth signal to block passage of spurious signals other than the desired said fourth signal.

5. Apparatus as in claim 4 wherein the means for generating comprises a subtraction means and the said fourth signal is defined by $NF_A$-14 $F_B$.

6. Apparatus as in claim 5 wherein the resonator means comprises a thickness shear variety type resonator.

7. Apparatus as in claim 6 wherein the resonator means comprises a singly rotated resonator.

8. Apparatus as in claim 6 wherein the resonator means comprises a doubly rotated resonator.

9. Apparatus as in claim 3 wherein each of the impedance units comprises a resistor.

10. Apparatus as in claim 4 wherein the means for filtering comprises a low pass filter.

11. Apparatus as in claim 1 further comprising means for exciting said resonator means for generating said at least two frequency signals, the means for exciting comprising:
    a single loop dual mode oscillator circuit comprising a single active gain element biased to produce enhanced nonlinear distortion and mixing products, and first and higher harmonic signals, respectively, and bandpass filter means for use in selecting the mixing product defined as $NF_A$-$F_B$.

12. Apparatus as in claim 1 wherein $F_A$ is the fundamental harmonic frequency signal and N is 3.

13. Apparatus for sensing temperature comprising, in combination:
    a single resonator means connected for generating at least two different C-mode harmonic frequency signals defined as $F_A$ and $F_B$, wherein $F_B$ has a higher harmonic number relative to $F_A$, the ratio of the higher harmonic number to the lower harmonic number being defined as N;
    means for generating a third signal whose frequency is 1/N times the frequency of $F_B$; and
    means for generating a fourth signal which is the resultant of the subtraction of said third signal from $F_A$, wherein said fourth signal is used in the sensing of temperature.

14. Apparatus as in claim 13 wherein the means for generating comprises a subtraction means and the said fourth signal is defined by $F_A - (1/N) \times F_B$.

* * * * *

UNITED STATES PATENT AND TRADEMARK OFFICE
CERTIFICATE OF CORRECTION

PATENT NO. : 4,872,765
DATED : Oct. 10, 1989
INVENTOR(S) : STANLEY S. SCHODOWSKI

It is certified that error appears in the above—identified patent and that said Letters Patent is hereby corrected as shown below:

Column 1, line 17, insert after "sensing" --temperature use, for example, semiconductor devices which depend--;

line 59, delete "(C)";

Column 3, line 65, equation "$F_o = F_a - F_{b/n}$" should read --$F_o = F_a - F_b/n$--;

Column 5, line 55, delete "single as" and insert --signals--;

Column 6, line 25, equation "$NF_A - 14F_B$" should read --$NF_A - F_B$--.

Signed and Sealed this

Thirteenth Day of November, 1990

Attest:

HARRY F. MANBECK, JR.

*Attesting Officer*   *Commissioner of Patents and Trademarks*